United States Patent
Li (10) Patent No.: US 10,345,643 B2
(45) Date of Patent: Jul. 9, 2019

(54) ARRAY SUBSTRATE, PRODUCTION METHOD OF THE SAME, AND LIQUID CRYSTAL DISPLAY PANEL AND DISPLAY APPARATUS COMPRISING THE SAME

(71) Applicant: BOE TECHNOLOGY GROUP CO., LTD., Beijing (CN)

(72) Inventor: Haixu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/795,186

(22) Filed: Oct. 26, 2017

(65) Prior Publication Data

US 2018/0275462 A1    Sep. 27, 2018

(30) Foreign Application Priority Data

Mar. 24, 2017  (CN) .......................... 2017 1 0183218

(51) Int. Cl.
| | |
|---|---|
| G02F 1/1335 | (2006.01) |
| H01L 33/06 | (2010.01) |
| H01L 27/12 | (2006.01) |
| H01L 33/00 | (2010.01) |
| G02F 1/1368 | (2006.01) |
| G02F 1/1362 | (2006.01) |
| H01L 25/075 | (2006.01) |
| H01L 33/32 | (2010.01) |
| H01L 33/60 | (2010.01) |
| G02F 1/1333 | (2006.01) |
| H01L 25/16 | (2006.01) |

(52) U.S. Cl.
CPC ...... *G02F 1/133603* (2013.01); *G02F 1/1362* (2013.01); *G02F 1/1368* (2013.01); *G02F 1/133608* (2013.01); *G02F 1/133621* (2013.01); *H01L 25/0753* (2013.01); *H01L 27/1214* (2013.01); *H01L 27/1259* (2013.01); *H01L 33/0075* (2013.01); *H01L 33/06* (2013.01); *G02F 2001/133302* (2013.01); *G02F 2202/10* (2013.01); *G02F 2202/108* (2013.01); *H01L 25/167* (2013.01); *H01L 33/007* (2013.01); *H01L 33/32* (2013.01); *H01L 33/60* (2013.01)

(58) Field of Classification Search
CPC .................................................. G02F 1/133603
USPC ....................................................... 349/69, 70
See application file for complete search history.

(56) References Cited

U.S. PATENT DOCUMENTS

2008/0067536 A1*  3/2008  Komoto .............. G02B 6/0023
                                                          257/98

FOREIGN PATENT DOCUMENTS

| CN | 102983234 A | | 3/2013 |
|---|---|---|---|
| CN | 105609596 A | * | 5/2016 |
| CN | 105609596 A | | 5/2016 |

OTHER PUBLICATIONS

First Chinese Office Action dated Mar. 4, 2019, received for corresponding Chinese Application No. 201710183218.9.

* cited by examiner

*Primary Examiner* — Edmond C Lau
(74) *Attorney, Agent, or Firm* — Kinney & Lange, P.A.

(57) ABSTRACT

This disclosure provides an array substrate for a liquid crystal display panel, comprising: a base substrate; a light-emitting diode back light source deposited on one surface of the base substrate; and thin film transistor on the other surface of the base substrate. This disclosure also provides a production method of an array substrate, a liquid crystal display panel, and a display apparatus.

15 Claims, 4 Drawing Sheets

ARRAY SUBSTRATE, PRODUCTION METHOD OF THE SAME, AND LIQUID CRYSTAL DISPLAY PANEL AND DISPLAY APPARATUS COMPRISING THE SAME

CROSS-REFERENCE TO RELATED APPLICATION

This application claims the priority of Chinese Patent Application No. 201710183218.9 entitled "Display Panel, Production Method of Solid Light Source, and Solid Light Source" filed on Mar. 24, 2017, the entire contents of which are incorporated herein by reference.

TECHNICAL FIELD

This disclosure relates to the technical field of TFT-LCD, and particularly to an array substrate, a production method of the same, and a liquid crystal display panel and a display apparatus comprising the same.

BACKGROUND

With the continuous development of the display industry, the requirements for display quality and display effect of thin film transistor (TFT) liquid crystal displays (LCDs) are continuously increased. Existing back light sources require complex structures such as a light guide plate, a light source, and the like, which occupy the space of the display panel. Additionally, the back light source is a separate module and is required to be operationally attached to a TFT substrate, resulting in an increased thickness of the display panel. A commonly-used light source of a daylight lamp contains a mercury medium, which may volatilize due to heating, and may be prone to cause the pollution of mercury vapor.

SUMMARY

An embodiment of this disclosure provides an array substrate for a liquid crystal display panel, comprising:
  a base substrate;
  a light-emitting diode back light source deposited on one surface of the base substrate; and
  a thin film transistor on the other surface of the base substrate.

In one embodiment, the light-emitting diode back light source is a GaN-based light-emitting diode.

In one embodiment, the back light source is a white light source comprising arranged three types of primary-color light-emitting chips.

In one embodiment, the light-emitting diode back light source comprises:
  a GaN buffering layer deposited on said other surface of the base substrate,
  three types of primary-color light-emitting chips arranged on the GaN buffering layer, wherein the primary-color light-emitting chip comprises:
    a first electrode on the GaN buffering layer,
    a first-type GaN layer on the first electrode,
    a quantum well layer on the first-type GaN layer,
    a second-type GaN layer on the quantum well layer, and
    a second electrode on the second-type GaN layer.

In one embodiment, the first-type GaN is n-type GaN and the second-type GaN is p-type GaN, or the first-type GaN is p-type GaN and the second-type GaN is n-type GaN.

In one embodiment, the quantum well layer is doped or undoped indium gallium nitride.

In one embodiment, the primary-color light-emitting chip is a red, green, or blue light-emitting chip,
  the quantum well layer in the red light-emitting chip is undoped indium gallium nitride,
  the quantum well layer in the green light-emitting chip is phosphorus- or arsenic-doped indium gallium nitride, and
  the quantum well layer in the blue light-emitting chip is silicon-, carbon-, or aluminum-doped indium gallium nitride.

In one embodiment, the light-emitting diode back light source further comprises a filling medium covering the primary-color light-emitting chip and a reflective layer on the filling medium.

In one embodiment, here,
  the buffering layer has a thickness of 1000-3000 Å; the first electrode has a thickness of 500-2000 Å; the first-type GaN layer has a thickness of 1500-2500 Å; the quantum well layer has a thickness of 2000-3500 Å; the second-type GaN layer has a thickness of 1500-2500 Å; and the second electrode has a thickness of 500-2000 Å.

In one embodiment, the primary-color light-emitting chip has a width of 3-10 µm.

An embodiment of this disclosure provides a method for producing the array substrate for a liquid crystal display panel as described above, comprising:
  depositing a light-emitting diode back light source on one surface of a base substrate; and
  forming a thin film transistor on the other surface of the base substrate.

In one embodiment, said depositing a light-emitting diode back light source on one surface of a base substrate comprises:
  depositing gallium nitride on the surface of the base substrate to form a gallium nitride buffering layer;
  depositing a first electrode layer on the gallium nitride buffering layer and exposing part of the gallium nitride buffering layer by patterning so as to produce a plurality of separately arranged first electrodes, each of which is used for one primary-color light-emitting chip;
  depositing first-type gallium nitride on the first electrodes and the exposed gallium nitride buffering layer to form a first-type gallium nitride layer;
  depositing indium gallium nitride on the first-type gallium nitride layer to form a quantum well layer;
  doping the quantum well layer at each position of the primary-color light-emitting chips by using a mask, wherein the quantum well layer is doped with a different material at a position of primary-color light-emitting chips with a different color;
  depositing second-type gallium nitride on the quantum well layer to form a second-type gallium nitride layer;
  patterning the first-type gallium nitride layer, the quantum well layer, and the second-type gallium nitride layer corresponding to the first electrodes;
  depositing a second electrode on the second-type gallium nitride layer and patterning to form primary-color light-emitting chips;
  filling gaps between primary-color light-emitting chips and covering the second electrode by using a filling medium; and
  depositing a reflective layer on the filling medium.

In one embodiment, the primary-color light-emitting chip is a red, green, or blue light-emitting chip, and
  doping the quantum well layer with a different material at a position of primary-color light-emitting chips with a different color comprises:

doping the quantum well layer at the position of the green chip with phosphorus or arsenic; and doping the quantum well layer at the position of the blue chip with silicon, carbon, or aluminum.

In one embodiment, the mask is a photoresist mask.

In one embodiment, said patterning the first-type gallium nitride layer, the quantum well layer, and the second-type gallium nitride layer comprises patterning by dry etching.

In one embodiment, said depositing a second electrode on the second-type gallium nitride layer and patterning comprises patterning by a wet etching process.

An embodiment of this disclosure provides a liquid crystal display panel, comprising: the array substrate as described above; and a liquid crystal panel mounted at the side of the thin film transistor of the array substrate.

An embodiment of this disclosure provides a display apparatus comprising the liquid crystal display panel as described above.

BRIEF DESCRIPTION OF THE DRAWINGS

Various other advantages and benefits will become clear and apparent to those of ordinary skill in the art by reading the detailed description of preferred embodiments hereinafter. The accompanying drawings are only for the purpose of illustrating preferred embodiments, and should not be considered as limitations to this disclosure. In all of the accompanying drawings, the same reference numeral represents the same member. In the drawings.

DETAILED DESCRIPTION

Embodiments of this disclosure are proposed so as to provide an array substrate, a production method of the same, a display panel, and a display apparatus, which at least solve some problems in the prior art. Embodiments of this disclosure also provide a production method of a solid light source and a solid light source.

This disclosure provides an array substrate for a liquid crystal display panel, comprising:

a base substrate;

a light-emitting diode back light source deposited on one surface of the base substrate; and a thin film transistor on the other surface of the base substrate.

Unlike separate back light modules conventionally used in liquid crystal display panels, a light-emitting diode is directly deposited as a back light source on the back side (i.e., the opposite side of the side where the TFT is located) of an array substrate in an embodiment of this disclosure. Thus, the thickness and the weight of the TFT-LCD may be reduced.

A GaN-based light-emitting diode is particularly suitable to be directly deposited as a back light source on the back side of an array substrate, because it has a wide range of light emission, a low power consumption, a long service life, and a short response time.

As a back light source of a liquid crystal display panel, it is typically required to emit white light. An LED which directly emits white light may be selected as a back light source. However, densely arranged three types of primary-color light-emitting chips may also be used to emit light, wherein emitted lights of three primary colors are mixed into a white back light. Generally, three primary colors may be three primary colors of red, green, and blue (RGB), but may also be other primary colors.

Particularly, in one embodiment, the light-emitting diode back light source comprises:

a GaN buffering layer deposited on said other surface of the base substrate, three types of primary-color light-emitting chips arranged on the GaN buffering layer, wherein the primary-color light-emitting chip comprises:

a first electrode on the GaN buffering layer, a first-type GaN layer on the first electrode, a quantum well layer on the first-type GaN layer, a second-type GaN layer on the quantum well layer, and a second electrode on the second-type GaN layer.

Here, the primary-color light-emitting chip may be a heterojunction-type LED. That is, the first-type GaN is n-type GaN and the second-type GaN is p-type GaN, or the first-type GaN is p-type GaN and the second-type GaN is n-type GaN.

The functions of the buffering layer include to provide a good environment for deposition of the heterojunction-type LED, and to avoid the contamination caused by the impurities in the base substrate.

The use of a GaN-based LED as a back light source may have the advantage that the color of light emission of the primary-color light-emitting chip may be determined by adjusting the doping in the quantum well layer.

For example, when three primary colors are RGB, the quantum well layer in the red light-emitting chip may be undoped indium gallium nitride, the quantum well layer in the green light-emitting chip may be phosphorus- or arsenic-doped indium gallium nitride, and the quantum well layer in the blue light-emitting chip may be silicon-, carbon-, or aluminum-doped indium gallium nitride.

In order to enhance light emission, a reflective layer may also be provided so that all light is transmitted through the base substrate and is emitted from the side of the thin film transistor. Glass may be typically selected as the base substrate.

The buffering layer preferably has a thickness of 1000-3000 Å. The first electrode preferably has a thickness of 500-2000 Å. The first-type GaN layer preferably has a thickness of 1500-2500 Å. The quantum well layer preferably has a thickness of 2000-3500 Å. The second-type GaN layer preferably has a thickness of 1500-2500 Å. The second electrode preferably has a thickness of 500-2000 Å. The reflective layer preferably has a thickness of 3000-10000 Å, more preferably 5000-7000 Å.

Most preferably, the buffering layer has a thickness of 2000 Å; the first electrode has a thickness of 1000 Å; the first-type GaN layer has a thickness of 2000 Å; the quantum well layer has a thickness of 3000 Å; the second-type GaN layer has a thickness of 2000 Å; the second electrode has a thickness of 1000 Å, and the reflective layer has a thickness of 6000 Å.

In view of light-emitting properties and the process of production, the primary-color light-emitting chip may have a width of 3-10 μm.

This disclosure provides a display panel, the substrate of which comprises two sides which are a front side and a back side, wherein a thin film transistor is provided on the front side of the substrate and a solid light source is directly produced on the back side of the substrate.

This disclosure provides a production method of a solid light source, comprising:

depositing gallium nitride on the surface of a substrate to form a gallium nitride buffering layer;

depositing an alloy on the gallium nitride buffering layer and producing an electrode with a fixed line width by a patterning process to form an n-type electrode layer;

depositing n-type gallium nitride on the n-type electrode layer to form an n-type gallium nitride layer;

depositing indium gallium nitride on the n-type gallium nitride layer to form a quantum well layer;

doping different areas of the quantum well layer with different dopants;

depositing p-type gallium nitride on the quantum well layer to form a p-type gallium nitride layer;

forming the n-type gallium nitride layer, the quantum well layer, and the p-type gallium nitride layer into a primary-color chip having the same width as that of the n-type electrode by a patterning process;

depositing an alloy on the p-type gallium nitride layer and producing an electrode having the same width as that of the n-type electrode by a patterning process to form a p-type electrode layer;

filling the gap between two adjacent primary-color chips and covering the p-type electrode layer by using a filling medium; and depositing a reflective layer on the filling medium.

Optionally, said doping different areas of the quantum well layer with different dopants comprises:

doping an area of a G primary-color chip with any dopant of phosphorus and arsenic; and doping an area of a B primary-color chip with any dopant of silicon, carbon, and aluminum.

Optionally, said doping an area of a G primary-color chip with any dopant of phosphorus and arsenic comprises:

shielding indium gallium nitride outside the area of the G primary-color chip by using a photoresist;

doping exposed indium gallium nitride with any dopant of phosphorus and arsenic; and removing the photoresist.

Optionally, an area of an R primary-color chip is an undoped intrinsic light-emitting area.

Optionally, said forming the n-type gallium nitride layer, the quantum well layer, and the p-type gallium nitride layer into a primary-color chip having the same width as that of the n-type electrode by a patterning process comprises:

etching the p-type gallium nitride, the indium gallium nitride, and the n-type gallium nitride by using a dry etching process, wherein any of the p-type gallium nitride, the indium gallium nitride, and the n-type gallium nitride after etching is as wide as the n-type electrode.

Optionally, said producing an electrode having the same width as that of the n-type electrode by a patterning process to form a p-type electrode layer comprises:

etching an alloy by using a wet etching process to form a p-type electrode, wherein the p-type electrode after etching is as wide as the n-type electrode.

Optionally, before said depositing gallium nitride on the surface of a substrate to form a gallium nitride buffering layer, the method further comprises:

turning over the substrate to produce the solid light source on the back side of the substrate.

In order to solve the problem described above, this disclosure further discloses a solid light source, comprising:

an n-type electrode layer, an n-type gallium nitride layer, a quantum well layer, a p-type gallium nitride layer, and a p-type electrode layer;

wherein the n-type electrode layer, the n-type gallium nitride layer, the quantum well layer, the p-type gallium nitride layer, and the p-type electrode layer are superimposed in this order upwardly from the surface of the substrate, and have the same line width; and different areas of the quantum well layer are doped with different dopants.

Optionally, it further comprises: a gallium nitride buffering layer, a reflective layer, and a filling medium; wherein the gallium nitride buffering layer is provided between the substrate and the n-type electrode layer and covers the whole surface of the substrate;

the filling medium comprises a part filled between two adjacent primary-color chips and a part overlying on the p-type electrode layer; and the reflective layer is provided on the filling medium and covers the whole substrate.

Optionally, the filling medium is a phenolic resin; and the material of the reflective layer is a titanium-palladium alloy.

Optionally, the material of the n-type gallium nitride layer is gallium nitride doped with silicon, and the material of the p-type gallium nitride layer is gallium nitride doped with magnesium.

Optionally, the materials of the n-type electrode layer and the p-type electrode layer are a nickel-silver alloy.

Optionally, all of the thicknesses of the gallium nitride buffering layer, the n-type gallium nitride layer, and the p-type gallium nitride layer are 2000 Å;

all of the thicknesses of the n-type electrode layer and the p-type electrode layer are 1000 Å;

the thickness of the quantum well layer is 3000 Å; and the thickness of the reflective layer is 6000 Å.

Optionally, the line width of the n-type electrode layer is 3-10 μm.

This disclosure further provides a method of producing the array substrate described above, comprising: depositing a light-emitting diode back light source on one surface of a base substrate; and forming a thin film transistor on the other surface of the base substrate.

Particularly preferably, the GaN-based light-emitting diode described above is formed as a light source on the base substrate. At this time, this method may comprise:

depositing gallium nitride on the surface of the base substrate to form a gallium nitride buffering layer;

depositing a first electrode layer on the gallium nitride buffering layer and exposing part of the gallium nitride buffering layer by patterning so as to produce a plurality of separately arranged first electrodes, each of which is used for one primary-color light-emitting chip;

depositing first-type gallium nitride on the first electrodes and the exposed gallium nitride buffering layer to form a first-type gallium nitride layer;

depositing indium gallium nitride on the first-type gallium nitride layer to form a quantum well layer;

doping the quantum well layer at each position of the primary-color light-emitting chips by using a mask, wherein the quantum well layer is doped with a different material at a position of primary-color light-emitting chips with a different color;

depositing second-type gallium nitride on the quantum well layer to form a second-type gallium nitride layer;

patterning the first-type gallium nitride layer, the quantum well layer, and the second-type gallium nitride layer corresponding to the first electrodes;

depositing a second electrode on the second-type gallium nitride layer and patterning to form primary-color light-emitting chips;

filling gaps between primary-color light-emitting chips and covering the second electrode by using a filling medium; and depositing a reflective layer on the filling medium.

This method has the advantage that functional layers of various primary-color light-emitting chips are produced together and then various shapes of chips are respectively formed by patterning to enable a high-precision and simple production process. Particularly, primary-color light-emitting chips having different colors may be obtained by doping quantum wells respectively.

When three primary colors are RGB, the doped material may be as described above. The doping process may be a doping process commonly used in the art.

Preferably, a photoresist is used as a mask to perform doping. In this process, a first photoresist mask is used to shield an area which is not undesired to be doped, so as to expose an area of a certain primary color and perform corresponding doping. Subsequently, the first photoresist mask is removed a second photoresist mask overlies, so as to expose an area of a second primary color and perform doping. Similarly, an area of a third primary color is doped. Changing the color of light emission by doping is highly precise and cost effective.

With respect to various steps, different patterning methods may be used. For example, said patterning the first-type gallium nitride layer, the quantum well layer, and the second-type gallium nitride layer comprises patterning by dry etching. Said depositing a second electrode on the second-type gallium nitride layer and patterning comprises patterning by a wet etching process.

This disclosure further provides a liquid crystal display panel comprising the array substrate described above. The liquid crystal display panel thus formed does not have any separate back light module, and steps of production, transportation, assembly, sealing, and the like of the back light module are omitted and the thickness and the weight of the TFT-LCD are reduced.

This disclosure further provides a liquid crystal display apparatus comprising the liquid crystal display panel described above.

This disclosure provides a display panel, the substrate of which comprises two sides which are a front side and a back side, wherein a thin film transistor is provided on the front side of the substrate and a solid light source produced according to the production method described above is provided on the back side of the substrate.

In a display panel provided in an embodiment of this disclosure, a thin film transistor is provided on the front side of the substrate and a solid light source is directly produced on the back side of the substrate, the attachment of the back light source to the array substrate is not required and the display panel is lighter and thinner. Additionally, the solid light source on the back side of the display panel does not contain any mercury medium, and the display panel is more environmentally friendly.

Further, the light emission principle of the solid light source is different from those of commonly-used incandescent lamps and gas discharge lamps, and therefore the solid light source has a high energy conversion efficiency, a low power consumption, and a long service life.

Exemplary embodiments of this disclosure will be described in further detail below with reference to accompanying drawings. Although exemplary embodiments of this disclosure are shown in the accompanying drawings, it is to be understood that this disclosure may be achieved in form various forms and should not be limited by the embodiments elaborated herein. On the contrary, these embodiments are provided to understand this disclosure more thoroughly and to be capable of fully conveying the scope of this disclosure to the person skilled in the art.

Figure 8:
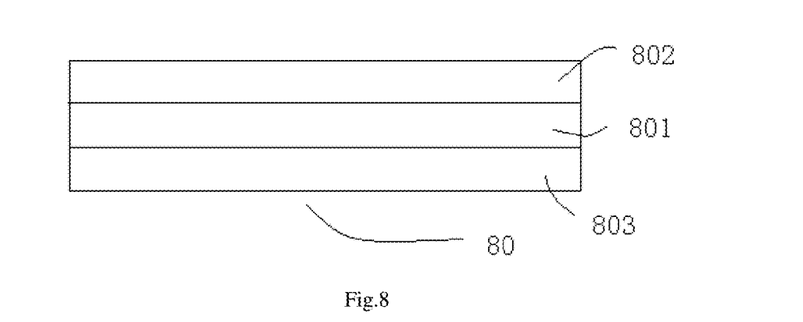
FIG. 8 is a schematic diagram of an array substrate in an Example of this disclosure.

FIG. 8 shows an array substrate 80 in an embodiment of this disclosure, which comprises a base substrate 801, a back light source 803 deposited on the base substrate, and a thin film transistor 802 on the other surface of the base substrate.

Figure 9:
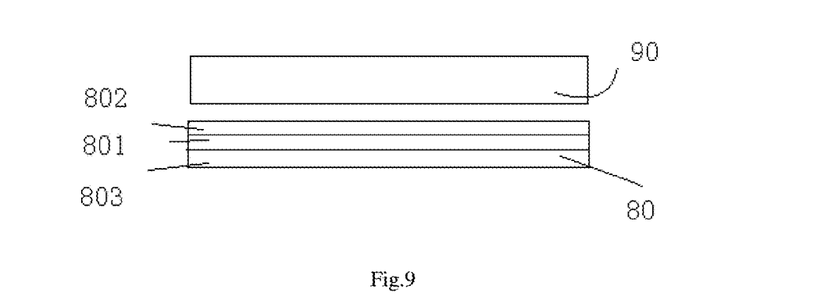
FIG. 9 is a schematic diagram of a liquid crystal display panel in an Example of this disclosure.

FIG. 9 shows a liquid crystal display panel in an embodiment of this disclosure, which comprises an array substrate 80 and a liquid crystal panel 90. As can be seen, the liquid crystal display panel of this disclosure does not have any separate back light module.

Embodiment 1

Figure 1:
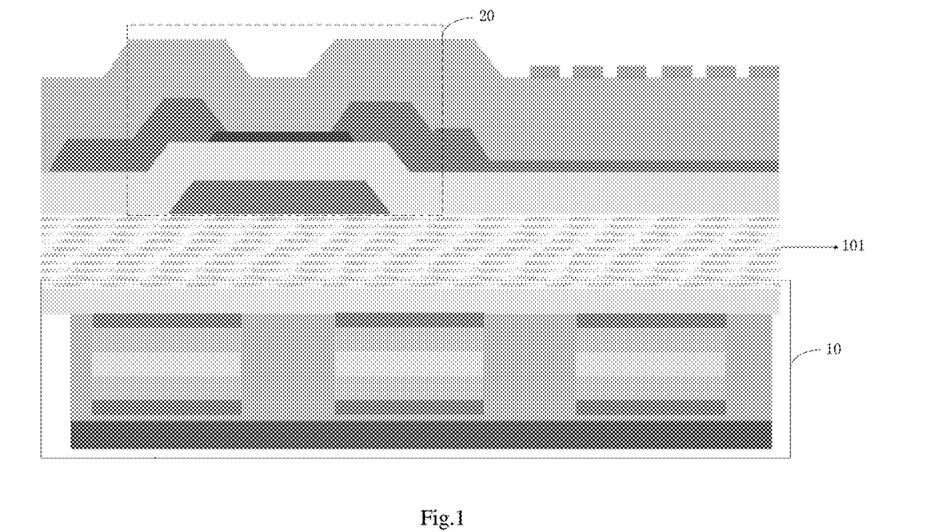
FIG. 1 is a sectional view of a display panel according to embodiment 1 of this disclosure.

With reference to FIG. 1, an array substrate for a liquid crystal display panel, which is provided in an embodiment of this disclosure, is shown.

In this array substrate, a base substrate 101 comprises two sides which are a front side and a back side, wherein a thin film transistor 20 is provided on the front side of the base substrate 101 and a solid light source 10 is directly produced on the back side of the base substrate 101.

In this embodiment, a base substrate 101 comprises two sides which are a front side and a back side, wherein a base substrate 101 is first turned over and a light-emitting diode back light source, i.e., a solid light source 10, is directly produced on the back side of the base substrate 101, and after the production of the solid light source 10 is complete, the base substrate 101 is turned over and a thin film transistor 20 is produced on the front side of the base substrate 101.

In summary, in embodiments of this disclosure, a thin film transistor is provided on the front side of a base substrate for an array substrate of a liquid crystal display panel, and a light-emitting diode back light source is directly produced on the back side of the base substrate, and the attachment of the back light module to the array substrate is not required and the display panel is lighter and thinner.

Furthermore, the light-emitting diode as the back light source does not contain any mercury medium, and the display panel is more environmentally friendly. Further, the light emission principle of the solid light source is different from those of commonly-used incandescent lamps and gas discharge lamps, and therefore the solid light source has a high energy conversion efficiency, a low power consumption, and a long service life.

Embodiment 2

Figure 7:
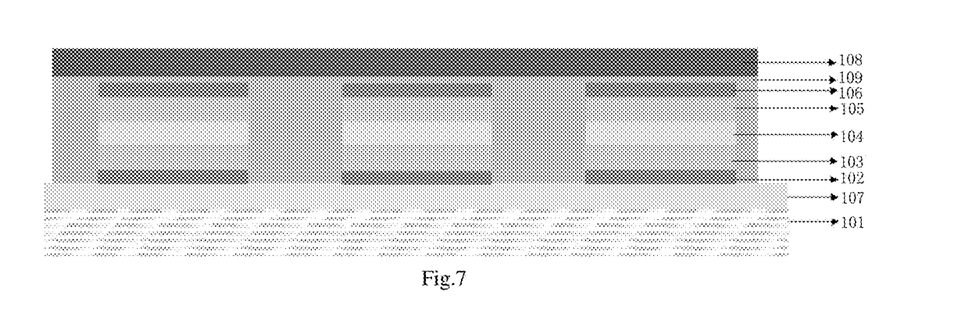
FIG. 7 is a sectional view of a solid light source according to embodiment 3 of this disclosure.

With reference to FIG. 7, a schematic diagram of an array substrate in an embodiment of this disclosure is shown. The array substrate comprises: a base substrate 101, a gallium nitride buffering layer 107, a first electrode 102, a first-type gallium nitride layer 103, a quantum well layer 104, a second-type gallium nitride layer 105, and a second electrode 106;

wherein the gallium nitride buffering layer 107, the first electrode 102, the first-type gallium nitride layer 103, the quantum well layer 104, the second-type gallium nitride layer 105, and the second electrode 106 are superimposed in this order upwardly from the surface of the base substrate 101, and have the same line width; and different areas of the quantum well layer are doped with different dopants.

The gallium nitride buffering layer 107 is provided between the base substrate 101 and the n-type electrode layer 102 and covers the whole surface of the substrate.

In one preferable embodiment of this disclosure, it further comprises a reflective layer 108 and a filling medium 109.

In one preferable embodiment of this disclosure, the filling medium 109 comprises a part filled between primary-color chips and a part overlying on the second-type electrode layer 106.

In one preferable embodiment of this disclosure, the reflective layer 108 is provided on the filling medium 109 and covers the whole substrate.

In one preferable embodiment of this disclosure, the filling medium 109 is a phenolic resin; and the material of the reflective layer 108 is a titanium-palladium alloy.

In one preferable embodiment of this disclosure, the first-type gallium nitride is n-type gallium nitride and the second-type gallium nitride is p-type gallium nitride, or the first-type gallium nitride is p-type gallium nitride and the second-type gallium nitride is n-type gallium nitride.

In one preferable embodiment of this disclosure, the material of the n-type gallium nitride layer 103 is gallium nitride doped with silicon, and the material of the p-type gallium nitride layer 105 is gallium nitride doped with magnesium.

In one preferable embodiment of this disclosure, the materials of the first electrode 102 and the second electrode 106 are a nickel-silver alloy.

In one preferable embodiment of this disclosure, all of the thicknesses of the gallium nitride buffering layer 107, the n-type gallium nitride layer 103, and the p-type gallium nitride layer 105 are 2000 Å;

In one preferable embodiment of this disclosure, all of the thicknesses of the n-type electrode layer 102 and the p-type electrode layer 106 are 1000 Å;

In one preferable embodiment of this disclosure, the thickness of the quantum well layer 104 is 3000 Å; and In one preferable embodiment of this disclosure, the thickness of the reflective layer 108 is 6000 Å.

In one preferable embodiment of this disclosure, the line width of the n-type electrode layer 102 is 3-10 µm.

In summary, in embodiments of this disclosure, the solid light source is produced on the array substrate, has a simple structure, and is integrated with the array substrate, and attachment is not required, allowing the display panel to be lighter and thinner. Furthermore, the solid light source uses gallium nitride and does not contain any mercury medium, allowing the display panel to be more environmentally friendly. Further, the light emission principle of the solid light source is different from those of commonly-used incandescent lamps and gas discharge lamps, and therefore the solid light source has a high energy conversion efficiency, a low power consumption, and a long service life.

Embodiment 3

A production method of an array substrate, which is provided in an embodiment of this disclosure, is introduced in detail.

The method comprises: depositing a light-emitting diode back light source on one surface of a base substrate; and forming a thin film transistor on the other surface of the base substrate.

Figure 2:
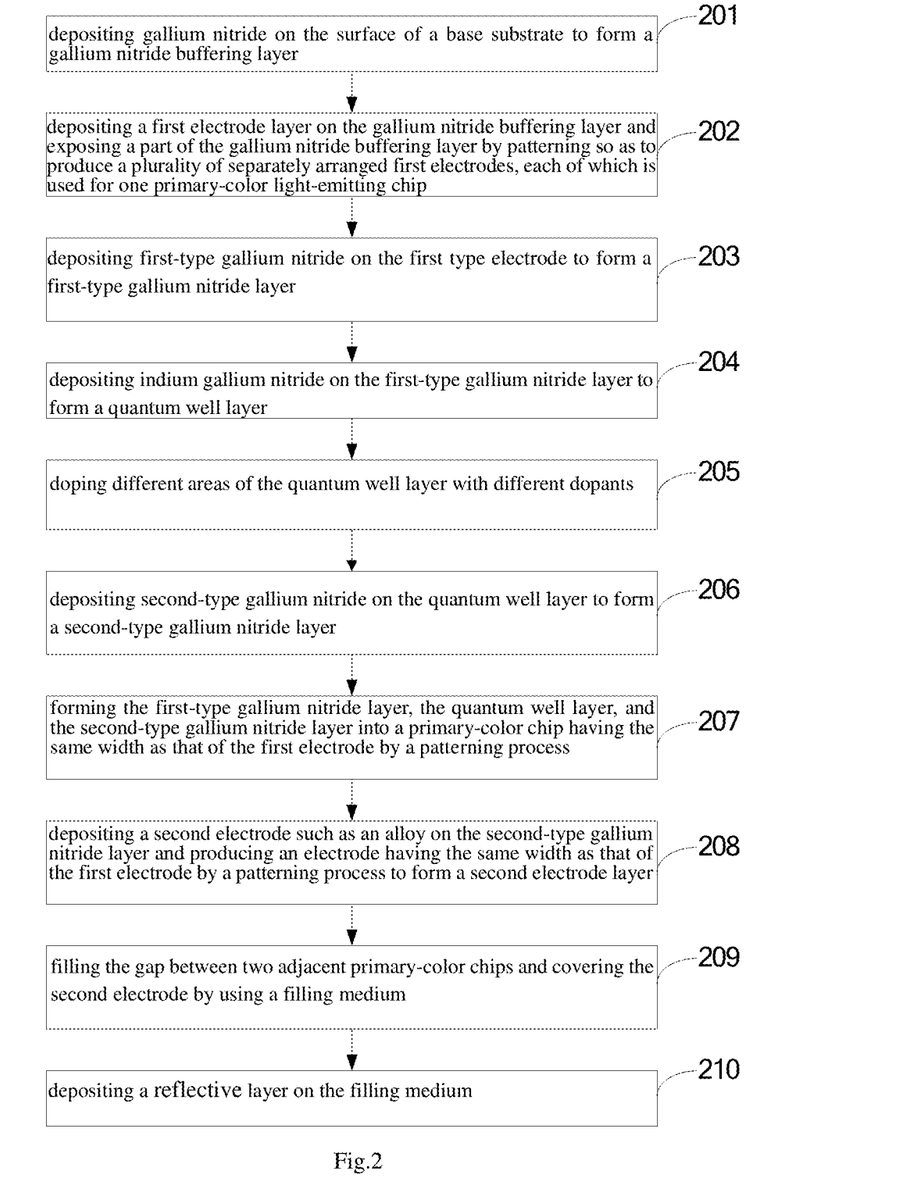
FIG. 2 is a flow chart of steps of a production method of a solid light source according to embodiment 2 of this disclosure.

FIG. 2 shows a flow chart of steps of depositing a light-emitting diode back light source on one surface of a base substrate in a production method of an array substrate comprising a GaN-based light-emitting diode back light source provided in an embodiment of this disclosure. The steps include:

Step 201, depositing gallium nitride on the surface of a base substrate to form a gallium nitride buffering layer.

In this embodiment, for producing the solid light source, a layer of gallium nitride GaN is first deposited on the surface of the substrate to cover the whole surface of the substrate. GaN is an extremely stable compound, which is hard and has a very high melting point, and the melting point is about 1700° C. Since GaN is hard, it becomes a good protective material for a coating layer. By depositing GaN on the surface of the substrate, on the one hand it may serve to protect the substrate, and on the other hand, it facilitates the deposition of the alloy to allow the n-type electrode layer and the substrate to be closely bonded and scarcely detached. There are various modes of depositing GaN, a conventional one is metal-organic chemical vapor deposition (MOCVD), such as atmospheric pressure MOCVD (APMOCVD) and low-pressure MOCVD (LPMOCVD). The depositing process of gallium nitride is not limited in detail in embodiments of this disclosure, and may be selected according to practical situations.

Step 202, depositing a first electrode layer on the gallium nitride buffering layer and exposing a part of the gallium nitride buffering layer by patterning so as to produce a plurality of separately arranged first electrodes, each of which is used for one primary-color light-emitting chip.

In this embodiment, after gallium nitride is deposited to form a gallium nitride buffering layer, a first electrode layer, such as an alloy, is deposited on the gallium nitride buffering layer. A sputtering apparatus may be used in the deposition of the alloy, or other apparatuses may be used. This is not limited in detail in embodiments of this disclosure, and may be selected according to practical situations.

Figure 3:
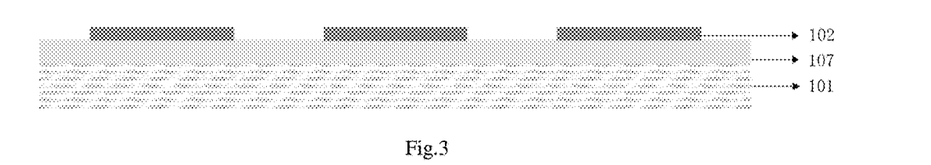
FIG. 3 is a sectional view after a patterning process for the n-type electrode layer according to embodiment 2 of this disclosure.

After the alloy is deposited, the alloy is patterned by a patterning process and produced into an electrode, so as to form a first electrode, as shown in FIG. 3. In FIG. 3, a silicon nitride buffering layer 107 is deposited on the surface of a base substrate 101, a first electrode 102 is on the silicon nitride buffering layer 107, and the width of the first electrode 102 may be a fixed line width. The line width of the electrode is not limited in detail in embodiments of this disclosure, and may be set according to practical situations.

Step 203, depositing first-type gallium nitride on the first type electrode to form a first-type gallium nitride layer.

In this embodiment, after the first electrode layer is formed, first-type gallium nitride is deposited. Description is made herein by exemplifying first-type gallium nitride which is n-type gallium nitride and second-type gallium nitride which is p-type gallium nitride, but this disclosure is not limited thereto. Particularly, a dopant is doped in the process of depositing n-type gallium nitride. The doped element may be a tetravalent element, such as silicon, or may be other elements. The doped dopant provides redundant electrons to gallium nitride, and allows the deposited gallium nitride to be n-type gallium nitride.

Step 204, depositing indium gallium nitride on the first-type gallium nitride layer to form a quantum well layer.

In this embodiment, after first-type gallium nitride is deposited to form a first-type gallium nitride layer, indium gallium nitride is deposited on the first-type gallium nitride layer to form a quantum well layer. MOCVD may be used in the deposition of indium gallium nitride, or other modes may be used. This is not limited in detail in embodiments of this disclosure, and may be selected according to practical situations.

Step 205, doping different areas of the quantum well layer with different dopants.

Figure 4:
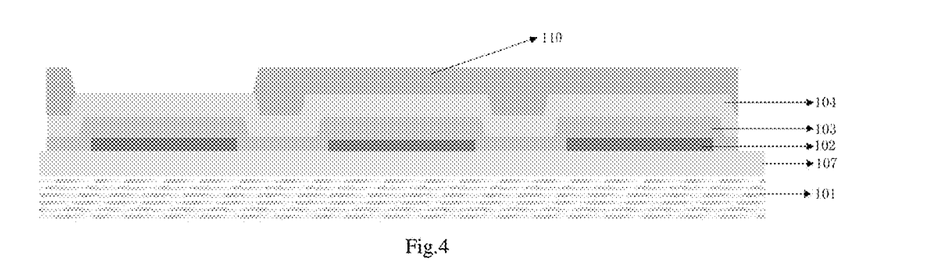
FIG. 4 is a sectional view of a doping process of a quantum well layer according to embodiment 2 of this disclosure.

In this embodiment, the quantum well layer is doped with a dopant, and the dopant is recombined with indium gallium nitride to emit light. Since the doped dopants are different, the wavelengths of light beams generated after recombination are different. Therefore, different areas of the quantum well layer are doped with different dopants. With reference to FIG. 4, three primary colors, which are R (red), G (green), and blue (B), may be formed, and different combinations of light emission of primary-color chips may form different colors. In FIG. 4, the base substrate 101, the silicon nitride buffering layer 107, the first electrode 102, the first-type silicon nitride layer 103, and the quantum well layer 104 are superimposed in this order from bottom to top. An area of the photoresist 110 which is not shielded is a doped area, and it corresponds to one type of primary-color light-emitting chip.

Different areas of the quantum well layer may specifically comprise an R primary-color chip area, a G primary-color chip area, and a B primary-color chip area. Preferably, an area of an R primary-color chip is an undoped intrinsic light-emitting area, and emits red light. an area of a G primary-color chip may be doped with any dopant of phosphorus and arsenic, or may be doped with other dopants. an area of a B primary-color chip is doped with any dopant of silicon, carbon, and aluminum, or may be doped with other dopants.

In one preferable embodiment of this disclosure, doping an area of a G primary-color chip with any dopant of phosphorus and arsenic may comprise the steps of:

S1, shielding indium gallium nitride beyond the area of the G primary-color chip using a photoresist 110, with reference to FIG. 4.

S2, doping exposed indium gallium nitride with any dopant of phosphorus and arsenic.

S3, removing the photoresist 110. At least one of wet photoresist-removing and dry photoresist-removing may be used in the process of removing the photoresist. This is not limited in detail in embodiments of this disclosure, and may be selected according to practical situations.

The doping of an area of a B primary-color chip may be similarly performed.

Step 206, depositing second-type gallium nitride on the quantum well layer to form a second-type gallium nitride layer.

In this embodiment, after the quantum well layer is doped with a dopant, p-type silicon nitride is deposited on the quantum well layer. In the process of depositing, a trivalent element, such as magnesium, may be doped, or other elements may be doped. The doped dopant provides redundant holes to gallium nitride so as to form a p-type gallium nitride layer.

Step 207, forming the first-type gallium nitride layer, the quantum well layer, and the second-type gallium nitride layer into a primary-color chip having the same width as that of the first electrode by a patterning process.

In this embodiment, since the etching properties of the first-type gallium nitride, the indium gallium nitride, and the second-type gallium nitride are different from that of the alloy of the second electrode, two patterning processes are performed on the first-type gallium nitride layer, the quantum well layer, and the second-type gallium nitride layer, as well as the alloy.

After the first-type gallium nitride, the indium gallium nitride, and the second-type gallium nitride are deposited, the first-type gallium nitride layer, the quantum well layer, and the second-type gallium nitride layer are patterned by a patterning process.

Figure 5:
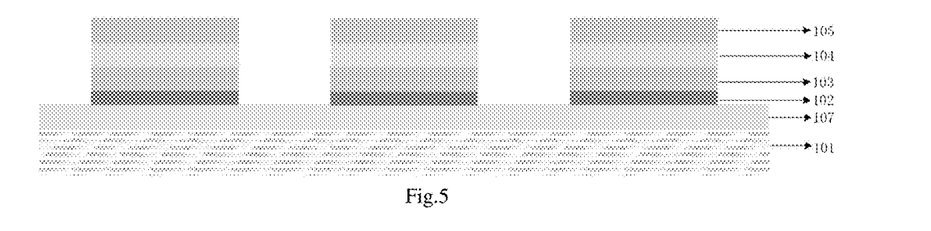
FIG. 5 is a sectional view after a patterning process for the primary-color chips according to embodiment 2 of this disclosure.

In one preferable embodiment of this disclosure, the second-type gallium nitride, the indium gallium nitride, and the first-type gallium nitride are etched by using a dry etching process, wherein any of the second-type gallium nitride, the indium gallium nitride, and the first-type gallium nitride after etching is as wide as the first electrode, with reference to FIG. 5. In FIG. 5, any of the second-type gallium nitride layer 105, the quantum well layer 104, and the first-type gallium nitride layer 103 is as wide as the first electrode layer 102.

Step 208, depositing a second electrode such as an alloy on the second-type gallium nitride layer and producing an electrode having the same width as that of the first electrode by a patterning process to form a second electrode layer.

In this embodiment, after the first-type gallium nitride layer, the indium gallium nitride layer, and the second-type gallium nitride layer are patterned, an alloy is deposited on the second-type gallium nitride layer, and the alloy is produced into an electrode having the same width as that of the first electrode by a patterning process to form a second electrode.

In one preferable embodiment of this disclosure, an alloy is etched by using a wet etching process to form a second electrode, wherein the second electrode after etching is as wide as the first electrode.

Figure 6:
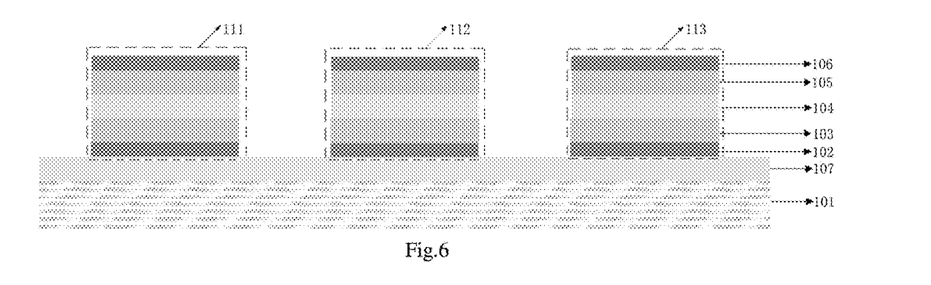
FIG. 6 is a sectional view after a patterning process for the p-type electrode layer according to embodiment 2 of this disclosure.

After the second electrode is formed, a light-emitting member composed of the first electrode layer 102, the first-type gallium nitride layer 103, the quantum well layer 104, the second-type gallium nitride layer 105, and the second electrode 106 may be an R primary-color chip 111, a G primary-color chip 112, or a B primary-color chip 113, with reference to FIG. 6.

Step 209, filling the gap between two adjacent primary-color chips and covering the second electrode by using a filling medium.

In this embodiment, after independent primary-color chips are formed, a filling medium is filled between two adjacent primary-color chips to separate the two primary-color chips. At the meanwhile, the filling medium covers the second electrode to protect the primary-color chip.

Step 210, depositing a reflective layer on the filling medium.

In this embodiment, after the production of the light-emitting member is complete, a reflective layer is deposited on the filling medium to reflect the light emitted from the primary-color chip to the other side of the base substrate so as to enhance back light emission of the array substrate.

In summary, in embodiments of this disclosure, the solid light source is produced on the array substrate, has a simple structure, and is integrated with the array substrate, and attachment is not required, allowing the display panel to be lighter and thinner. Furthermore, the process of production uses gallium nitride and does not contain any mercury medium, allowing the display panel to be more environmentally friendly. Further, the light emission principle of the solid light source is different from those of commonly-used incandescent lamps and gas discharge lamps, and therefore the solid light source has a high energy conversion efficiency, a low power consumption, and a long service life.

It is to be indicated that method embodiments described above are expressed as combinations of a series of actions for the purpose of simple description. However, it is to be known by the person skilled in the art that this disclosure is not limited by the order of the actions described, because certain steps may be performed in another order or in parallel according to this disclosure. Next, it is also to be known by the person skilled in the art that embodiments described in the specification are all belong to preferable embodiments, and the actions involved are not necessarily required by this disclosure.

It is to be understood by the person skilled in the art that embodiments of this disclosure may be provided as methods, apparatuses, or computer program products. Therefore, the form of a complete hardware embodiment, a complete software embodiment, or an embodiment combining aspects of software and hardware may be used as an embodiment of this disclosure. Additionally, the form of a computer program product implemented on one or more computer-usable storage media (including but not limited to a disk memory, a CD-ROM, an optical memory, etc.) comprising computer-usable program codes may be used as an embodiment of this disclosure.

Although preferable embodiments of this disclosure have been described, additional alterations and modifications may be made to these embodiments once the person skilled in the art knows the basic inventive concept. Therefore, the appended claims are intended to be construed to comprise preferable embodiments and all alterations and modifications falling in the scope of the embodiments of this disclosure.

Finally, it is to be further indicated that relational terms such as first, second, and the like are merely to distinguish one entity or operation from another entity or operation, and it does not necessarily require or imply that there is any actual relation or order between these entities and operations. Additionally, terms "include", "comprise", or any other variant, intends to cover nonexclusive inclusion, such that a process, method, article, or terminal device comprising a range of elements comprises not only those elements, but also other elements which are not specifically listed or elements intrinsically possessed by this process, method, article, or terminal device. In absence of more limitations, an element defined by a sentence "comprise a" does not exclude that there is additionally the same element in a process, method, article, or terminal device comprising this element.

An array substrate, a production method of the same, a liquid crystal display panel, and a display apparatus provided by this disclosure are introduced in detail above. Principles and embodiments of this disclosure are elaborated herein by using specific examples, and the description of the above examples is only used to help the understanding of the method of the present disclosure and the core idea thereof. At the meanwhile, with respect to those of ordinary skill in the art, modifications will be made to specific embodiments and application ranges according to the idea of this disclosure. In summary, the contents of this specification should not be construed to limit this disclosure.

What is claimed is:

1. An array substrate for a liquid crystal display panel, comprising:
   a base substrate;
   a light-emitting diode back light source deposited on a first surface of the base substrate; and
   a thin film transistor on a second surface of the base substrate;
   wherein the light-emitting diode back light source comprises:
   a GaN buffering layer deposited on said second surface of the base substrate,
   three types of primary-color light-emitting chips arranged on the GaN buffering layer, wherein each primary-color light-emitting chip comprises:
   a first electrode on the GaN buffering layer,
   a first-type GaN layer on the first electrode,
   a quantum well layer on the first-type GaN layer,
   a second-type GaN layer on the quantum well layer, and
   a second electrode on the second-type GaN layer.

2. The array substrate according to claim 1, wherein
   the first-type GaN layer is made of n-type GaN and the second-type GaN layer is made of p-type GaN; or
   the first-type GaN layer is made of p-type GaN and the second-type GaN layer is made of n-type GaN.

3. The array substrate according to claim 1, wherein the quantum well layer is doped or undoped indium gallium nitride.

4. The array substrate according to claim 3, wherein:
   the three types of primary-color light-emitting chips are red, green, and blue light-emitting chips;
   the quantum well layer in the red light-emitting chip is undoped indium gallium nitride;
   the quantum well layer in the green light-emitting chip is phosphorus- or arsenic-doped indium gallium nitride; and
   the quantum well layer in the blue light-emitting chip is silicon-, carbon-, or aluminum-doped indium gallium nitride.

5. The array substrate according to claim 1, wherein the light-emitting diode back light source further comprises a filling medium covering each primary-color light-emitting chip and a reflective layer on the filling medium.

6. The array substrate according to claim 1, wherein:
   the buffering layer has a thickness of 1000-3000 Å; the first electrode has a thickness of 500-2000 Å; the first-type GaN layer has a thickness of 1500-2500 Å; the quantum well layer has a thickness of 2000-3500 Å; the second-type GaN layer has a thickness of 1500-2500 Å; and the second electrode has a thickness of 500-2000 Å.

7. The array substrate according to claim 1, wherein each primary-color light-emitting chip has a width of 3-10 μm.

8. A method for producing the array substrate for a liquid crystal display panel according to claim 1, comprising:
   depositing the light-emitting diode back light source on the first surface of the base substrate; and
   forming the thin film transistor on the second surface of the base substrate.

9. The method according to claim 8, wherein depositing the light-emitting diode back light source on the first surface of the base substrate comprises:

depositing gallium nitride on the surface of the base substrate to form a gallium nitride buffering layer;

depositing a first electrode layer on the gallium nitride buffering layer and exposing part of the gallium nitride buffering layer by patterning so as to produce a plurality of separately arranged first electrodes, each of which is used for one primary-color light-emitting chip of a plurality of primary-color light emitting chips;

depositing first-type gallium nitride on the first electrodes and the exposed gallium nitride buffering layer to form a first-type gallium nitride layer;

depositing indium gallium nitride on the first-type gallium nitride layer to form a quantum well layer;

doping the quantum well layer at each position of the primary-color light-emitting chips by using a mask, wherein the quantum well layer is doped with a different material at a position of one of the primary-color light-emitting chips with a different color;

depositing second-type gallium nitride on the quantum well layer to form a second-type gallium nitride layer;

patterning the first-type gallium nitride layer, the quantum well layer, and the second-type gallium nitride layer corresponding to the first electrodes;

depositing a second electrode on the second-type gallium nitride layer and patterning to form the primary-color light-emitting chips;

filling gaps between the primary-color light-emitting chips and covering the second electrode by using a filling medium; and depositing a reflective layer on the filling medium.

10. The method according to claim 9, wherein the primary-color light-emitting chips are red, green, and blue light-emitting chips, and doping the quantum well layer with a different material at a position of one of the primary-color light-emitting chips with a different color comprises:

doping the quantum well layer at the position of the green chip with phosphorus or arsenic; and doping the quantum well layer at the position of the blue chip with silicon, carbon, or aluminum.

11. The method according to claim 9, wherein:

the mask is a photoresist mask.

12. The method according to claim 9, wherein said patterning the first-type gallium nitride layer, the quantum well layer, and the second-type gallium nitride layer comprises patterning by dry etching.

13. The method according to claim 9, wherein said depositing a second electrode on the second-type gallium nitride layer and patterning comprises patterning by a wet etching process.

14. A liquid crystal display panel, comprising:

the array substrate according to claim 1; and a liquid crystal panel mounted at a side of the thin film transistor of the array substrate.

15. A display apparatus comprising the liquid crystal display panel according to claim 14.

* * * * *